(12) United States Patent
Zgonik

(10) Patent No.: US 6,781,725 B2
(45) Date of Patent: Aug. 24, 2004

(54) CONFOCAL HOLOGRAPHIC OPTICAL STORAGE WITH NON-OVERLAPPING RECORDS

(75) Inventor: Marko Zgonik, Ljubljana (SI)

(73) Assignee: Institut "Jozef Stefan", Ljubljana (SI)

( * ) Notice: Subject to any disclaimer, the term of this patent is extended or adjusted under 35 U.S.C. 154(b) by 0 days.

(21) Appl. No.: 10/344,947

(22) PCT Filed: Aug. 22, 2001

(86) PCT No.: PCT/SI01/00022
§ 371 (c)(1),
(2), (4) Date: Feb. 19, 2003

(87) PCT Pub. No.: WO02/21535
PCT Pub. Date: Mar. 14, 2002

(65) Prior Publication Data
US 2003/0156309 A1 Aug. 21, 2003

(30) Foreign Application Priority Data
Aug. 25, 2000 (SI) .......................... P-200000197

(51) Int. Cl.$^7$ ................................................ G03H 1/04
(52) U.S. Cl. ...................... 359/35; 359/25; 365/125; 430/1
(58) Field of Search ............................... 359/21, 22, 25, 359/29, 35; 365/125, 216, 234; 430/1, 2

(56) References Cited

U.S. PATENT DOCUMENTS 4,094,011 A * 6/1978 Nagao ........................ 365/216

* cited by examiner

Primary Examiner—Leo Boutsikaris
(74) Attorney, Agent, or Firm—Connolly Bove Lodge & Hutz LLP; Myron K. Wyche

(57) ABSTRACT

The present invention relates to a method and a system for the storage of data in the form of volume holograms which do not mutually overlap. The storage medium consists of a high-sensitive material in the form of a plate of thickness D, in which a single hologram is essentially shaped as a cylinder with the minimal possible cross-section. The signal light beam is modulated with data and directed onto the plate-shaped storage material by means of a lens or a conventional optical system, illuminating an area of the material which, for a given amount of data, is the smallest possible. To record a hologram, a reference light beam is used, incident upon the storage material either from the same direction as the signal beam, or opposite thereto. The hologram is only written in the portion where the signal and the reference beams overlap.

11 Claims, 3 Drawing Sheets

CONFOCAL HOLOGRAPHIC OPTICAL STORAGE WITH NON-OVERLAPPING RECORDS

The present invention relates to a storage method and system for storing mutually non-overlapping volume holograms and to a confocal holographic optical data storage system with non-overlapping records. The invention pertains to the technical field of holographic optical data storage systems with high density storage capabilities. In the present patent application, a new method and system for storing data in the form of mutually non-overlapping three-dimensional holograms are disclosed.

The invention provides a solution to the technical problem of improving the manner in which data is stored in the holographic optical storage medium.

Optical storage is largely used today, e.g. in the form of music and data CDs, DVD discs and magneto-optical systems. All these systems are two-dimensional (2-D), which means they only store data in one plane or two at the most, the said two planes being both accessible from one side of the storage medium. The storage density is limited, by the nature of light as electromagnetic radiation, to approx. 1 bit per square area having the side equal in length to the wavelength of the light being used. For storing greater amounts of data—the capacity of 1000 CD-ROMs being set as a desired target—all three dimensions of the storage material must be put to use. The data density should be of 1 bit per volume of a cube having the side equal in length to the wavelength of the light being used. This would mean that into a cube with the side of 1 cm, using blue-green light with the wavelength lambda0 in vacuum of 500 nm, $10^{12}$ Bytes of data could be stored, thus exceeding the capacity of 1000 CD-ROMs. Since the refractive index of any storage material is greater than 1, the wavelength lambda inside said material is shorter than the wavelength lambda0 in vacuum. With a shorter wavelength, the volume data storage density is even greater than in the above example.

Of all the systems for three-dimensional data storage, holographic optical storage is the most promising. A general description of holographic optical storage is to be found among others in the U.S. Pat. Nos. 4,920,220, 5,450,218, 5,440,669 and 5,377,176, FR Pat. No. 2770912, GB Patent No. 2332754, and in the book "Nonlinear Optical Effects and Materials", Springer, 2000, Ed. P. Günter, in the chapter "Photorefractive Memories for Optical Processing", written by M. Duelli, G. Montemezzani, M. Zgonik, and P. Günter.

To store one page of data, containing typically 1000× 1000 bits in the form of a chessboard image with transparent and opaque pixels, the following procedure is used. The laser light beam is split into two coherent beams. The signal light beam is modulated with data and focused onto the optical storage material. Simultaneously, the said material is illuminated from the same or any other convenient direction by another light beam, referred to as the reference beam. While the hologram is being written, the signal and the reference beams interfere, and their interference pattern is recorded as a variation in the optical characteristics of the material, which is called a hologram. The data is read back by illuminating the same hologram with only the reference light beam, which, upon being refracted on the hologram, reconstructs the signal beam and, consequently, the recorded data.

The advantages of holographic optical storage over other systems are high data density and parallel read/write operation. Although said advantages have been known for nearly 40 years, these systems, despite all the efforts, have not become largely used. In recent years, however, the interest in the development and the commercialization of these systems has been growing again, owing to rising necessities and to the advancements made in the supporting optoelectronic technologies.

DESCRIPTION OF THE PRIOR ART

By using the three-dimensional technique of hologram recording, multiple holograms may be stored in the same volume. This is called multiplexing and, so far, a variety of multiplexing methods have been investigated, such as: angular multiplexing, wavelength multiplexing, phase correlation multiplexing and, finally, spatial multiplexing. Fundamentally, these methods are all based upon the Bragg diffraction selectivity on a three-dimensional hologram and they all use relatively wide reference beams to write and read holograms. The methods of multiplexing are relatively complex and, moreover, the writing of multiple holograms in the same space causes the diffraction efficiency of individual holograms to decline rapidly. The main reason for this is that the writing of each new hologram partially erases all the previous holograms. By conveniently selecting the hologram writing time sequence, it can be achieved that at the end of the writing procedure all the holograms have equal diffraction efficiency. In this case, their diffraction efficiency declines at a rate of $1/N^2$, where N is the number of holograms written in the same volume, which practically means that not more than 1000 holograms can be stored in the same volume. A further disadvantage with multiplexed holograms is that selective erasing of single holograms is difficult. Although selective erasing is possible, it poses such high requirements upon the mechanical stability of the storage system as a whole that it is extremely uneconomical. Another possibility for erasing a single hologram is to erase all the multiplexed holograms and discard the superfluous one, while rewriting the rest to a new spot. As a consequence of all the described problems related to multiplexing, all known methods of holographic data storage are still greatly limited in their use and still very far from reaching the theoretically predicted storage densities.

If the so-called photo refractive crystals are used as the storage material, a further serious drawback of the optical holographic storage emerges. A description of the characteristics and advantages of photo refractive crystals is found in the aforementioned book, "Nonlinear Optical Effects and Materials", Springer, 2000. The problem consists in the unwanted erasure of the holograms while they are being read out, which affects multiplexed holograms even more severely because of the low diffraction efficiency of single holograms. They must be read out by means of a stronger reference beam, which in turn erases all the holograms that are multiplexed in the same volume as the chosen one.

A search has been run through the patent databases by the keywords "holographic storage". In the European Patent Office database at http://ep.espacenet.com there were 295 hits when running the keyword search through title and abstract only. In the U.S. Patent Office at http://www.uspto.gov/patft/ there are 490 hits for the years 1999–2000 alone when running the keyword search through all fields. The most relevant patents and specialized bibliography of the field have been sifted. The most promising recent methods for simplifying the system of multiplexing are disclosed in the following patents. In the U.S. Pat. No. 5,844,700 data is recorded on a cylindrically shaped storage material, multiplexing is done by a translation of the cylinder along and a rotation about its axis, there being a considerable overlapping of consecutive holograms. In the U.S. Pat. No. 5,949,558 data is written onto a plate-shaped material, multiplexing is carried out by shifting the plate, while consecutive holograms likewise overlap considerably. A system similar to the one previously described is disclosed also in the patent CN 1159046. In the U.S. Pat. No. 6,040,930 a method of minimizing the volume of the hologram is disclosed by the authors, the results being, however, still far from what is theoretically possible.

The usual manner of optimizing the digital method of data storage is to minimize the space needed to store a single bit of information. For optical three-dimensional storage systems this would mean that, for each bit of information, the exact volume where the bit is stored is known, the minimal volume being a cube with its side equal to the wavelength of the light used. With holographic storage systems, on the contrary, the information about each particular bit is scattered throughout the volume of the recorded hologram. Since parallel reading and writing of large amounts of data is a major advantage of the holographic storage, the ability to write large numbers of bits in parallel is not something we are willing to sacrifice. What we do want at all costs, however, is to reduce the space needed to store the information, which is achieved by reducing the volume occupied by the hologram. If we were to combine optical holographic storage with any method of multiplexing which writes several additional holograms or parts thereof into the same volume, the situation would only get worse.

The object of the present invention is to eliminate hologram multiplexing in the shared volume of the storage material intended for optical storage, while at the same time making optimal use of the entire volume of the storage material.

According to the invention said object is achieved by a confocal holographic optical storage arrangement with non-overlapping records, as set forth in the independent patent claims.

According to the invention, the volume of the hologram is reduced to the very limit allowing still the hologram to be reconstructed with sufficient reliability. The advantages of this method of recording are that the diffraction efficiency of single holograms is improved, the attained data density approaches the theoretical limit, and the optical system is simpler. By the present invention, furthermore, selective erasing of single holograms is attained, while unwanted erasure of holograms during readout is substantially reduced. The material into which data is written is shaped as a plate, and between single writes/reads of the holograms we merely shift the relative positions of the optical system and the plate for such a distance in the plane of the plate that the two consecutive holograms do not overlap. This writing technique is compatible with the known techniques of writing to and reading from rotating disk-shaped materials, which is why its implementation is cheaper and more reliable.

DESCRIPTION OF THE INVENTION

The invention comprises a method and a system for storing and retrievixng data in the form of volume holograms which do not mutually overlap. The storage medium is made of a homogenous, light-sensitive material shaped as a plate of thickness D, in which a single hologram is essentially shaped as a cylinder with the smallest possible cross-section. The amount of data the signal light beam is loaded with is equal to $M^2$ bits. By means of a lens or a convenient optical system, the signal light beam is directed on the plate-shaped storage material, illuminating an area of said material at least equal to (2 times $M^2$ times the square of the wavelength of the light). In the case of a non-modulated signal light beam, a smaller area of the plate is illuminated. In such case the cross-section of the signal beam in the median of the plate is smallest, being equal to a circle with the radius equal to the wavelength of the light. The term "median of the plate" as used within the scope of this invention refers to the plane which is equidistant from both the surfaces of the storage plate.

To record a hologram, a reference light beam is used, incident upon the storage material either from the same direction as the signal beam, or from the opposite direction. According to the present invention and in contradistinction to prior-art solutions, in the most favorable case the reference light beam used for recording illuminates the smallest possible volume of the storage material. The great amount of written data per single hologram is achieved on account of the fast lateral modulation of the signal beam, because of which the diameter of the signal beam inside the plate is substantially larger than that of the reference beam. The hologram is only written in the portion where the signal and the reference beams overlap, so its volume is equal to the volume illuminated by the reference beam. Consecutive holograms of data are written in adjacent portions of the plate in such a way that they do not overlap. The light stream density of the reference beam is substantially greater than that of the signal beam, so while a particular hologram is being written, erasure of adjacent holograms is almost negligible. The hologram is read back by means of a reference beam identical to the one that was used for writing. To be sure, in the readout process the refracted signal beam does propagate through the portions of the plate that contain other holograms, but owing to the small light stream of the refracted beam the erasing of adjacent holograms is negligible.

The simplest beam which, at a given distance, is least dilated by refraction, is the so-called Gaussian beam. As known, such beams are emitted by appropriate lasers, whose output is usually referred to as TEM00. Therefore, for the holographic optical storage system, a laser with the output beam as similar as possible to TEM00 is selected. With an optical system which perpendicularly illuminates the plate from one side, it can be arranged for the smallest cross-section, the so-called waist, of the Gaussian beam to be located in the median of the plate thickness. By means of the optical system we can also select the waist radius to be $$W0 = \text{square root of } [\text{lambda } D/(2 \text{ Pi})], \tag{1}$$

where lambda is the wavelength of the light inside the plate and D is the thickness of the plate. Thereby the so-called confocal focusing is achieved, wherewith the diameters of the reference beam at both the entrance and the exit faces of the plate are smallest. This manner of focusing is frequently employed in non-linear optics. If we assume the volume of the hologram to be approximately equal to the volume of the cylinder with the base equal to the entrance and exit cross-sections of the reference beam and with the height equal to the thickness D of the plate, then the volume V of the hologram may be calculated as $$V = \text{lambda } D^2. \tag{2}$$

With the usual assumption that the maximum attainable storage density is 1 bit per volume of a cube having the side equal in length to the wavelength of the light, we may estimate the amount of information that can be stored in the selected volume as the number of bits $M^2 = (D/\text{lambda})^2$. In the case of a plate having a thickness of 1 mm and a refractive index 2, and with the selected wavelength of the light in vacuum of 500 nm, the maximum amount of information storable in a single hologram will be 8 Mbits. To fully exploit such a plate, therefore, 8 Mbits of information should be written in every hologram. On the other side, as it can be seen, the optimal thickness of the storage plate D=M lambda depends upon the spatial capability of the employed light modulator, expressed as the total number of its switching elements $M^2$, and upon the wavelength lambda of the used light inside the plate.

In modern optics, other types of beams that, at limited distances, exhibit only scarce variations of their cross-section are known as well. For the purposes of the present invention other beams besides TEM00 may be used as reference beams, provided they are given an adequate shape, thereby meeting the condition that the minimum cross-section of the beam be located inside the storage material.

In the case of the signal and the reference beams impinging on the plate at a certain angle not exceeding 45 degrees, the situation does not change substantially and in the first approximation the analysis set forth in the foregoing paragraphs may still be regarded as valid. In the ideal case we ensure that the waists of the unmodulated signal beam and the reference beam coincide, which is referred to as confocal geometry.

An additional advantage of the said invention over prior-art solutions is related to readout. For readout, a reference light beam may be used that impinges upon either side of the plate. In the case of a reference beam impinging upon the plate in the same direction that was used to write the hologram, the refracted beam also propagates in the same direction in which the signal beam was propagating at the moment of writing. In the other case, i.e. when reference beams of opposite directions are used for writing and for reading, respectively, a so-called phase conjugated signal beam is reconstructed, that is a signal beam propagating in the opposite direction to the signal beam used to write the hologram. A phase conjugated signal beam may be imaged on a light detector without any additional optics. In such case, to be sure, the light modulator and the light detector must have the same geometry.

The invention will be explained with reference to exemplary embodiments illustrated in the accompanying drawings, in which.

EMBODIMENTS OF THE INVENTION

While in the following description examples and details have been included, such as particular materials, wavelengths of light, optical system configurations, ways of modulating the signal beam etc., this has been done solely to facilitate understanding, and it will be appreciated by anyone skilled in the art of said particular examples and details that the present invention may be embodied in various alternative configurations and with different details.

Figure 1:
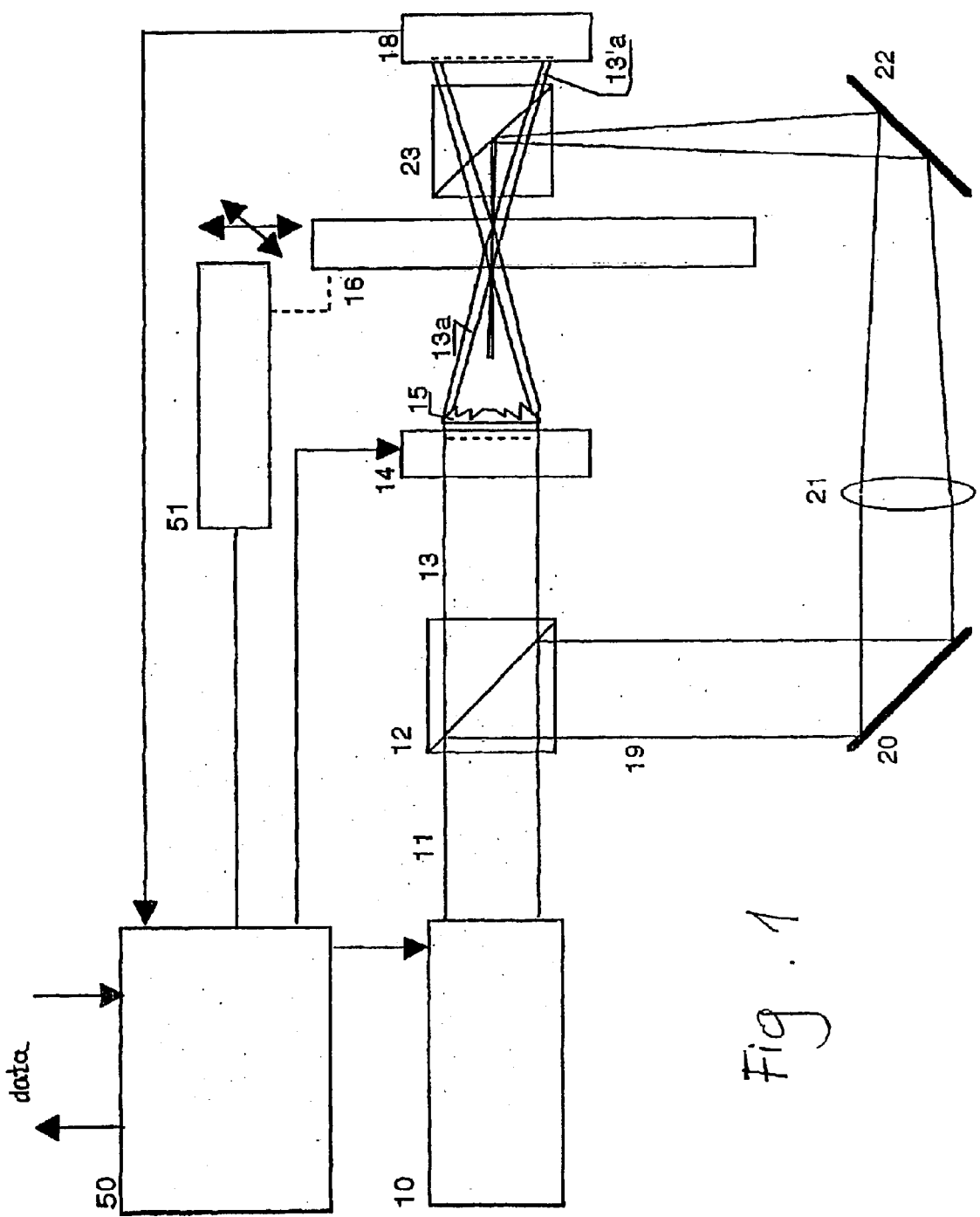
FIG. 1 is a schematic diagram of the system for holographic optical data storage and retrieval in a plate-shaped material using a confocal focusing arrangement and a reference light beam whose diameter is smaller than that of the area illuminated by the signal light beam.

FIG. 1 is a schematic diagram of an embodiment 1 of the system for holographic optical data storage and retrieval in a plate-shaped material 16. To write and read holograms, a laser 10 of a suitable wavelength and with a quality output beam 11 is required. The beam is split into a signal beam 13 and a reference beam 19 by a splitter 12. The signal beam travels through a modulator 14, which, being equipped with pixels with individually controllable permeability, amplitude-modulates the cross-section of the beam 13, thereby loading it with data. The lens 15, which may be a common lens, a Fresnel lens, or an array of microlenses, in close contact with the modulator 14, focuses the signal beam 13 into a beam, whose smallest cross-section lies in the median of the plate 16. In FIG. 1, a portion of the signal beam 13 is designated with the numeral 13a. The reference beam 19 is reflected from the mirror 20 and focused by the lens 21 of a suitable focal length. After being reflected from the mirror 22 and the splitter 23, the beam 19 is directed approximately perpendicularly to the plate 16 and into the center of the cross-section of the signal beam 13. The optical path from the lens 21 to the plate 16 is chosen depending on the characteristics of the laser beam so that by using a lens 21 of convenient focal length it can be arranged for the waist of the reference beam 19 to be located in the median of the plate 16, and for the radius of the waist to approximately equal to the radius of equation (1). During data recording the controller 50, assisted by the motion controller 51, sets the relative positions of the optical system and the plate 16. Thereupon, the controller 50 sends the data to be written to the light modulator 14 and switches on the laser 10 for a predetermined period, allowing the hologram to be written. To write the next hologram, the said process is repeated with the relative positions of the optical system and the plate 16 shifted.

The readout process is described hereinafter. The controller 50, assisted by the motion controller 51, sets the relative positions of the optical system and the plate 16, thereby selecting the chosen hologram. The controller then switches on the laser 10 with the light modulator 14 closed, so that the plate 16 is illuminated by the reference light beam 13 only. Upon refraction on the hologram, a beam is reconstructed, whose portion 13'a is denoted on FIG. 1. The signal beam travels through the beam splitter 23, where a portion of the light stream is lost, to the light detector 18, which is position-sensitive and must have at least as many sensitive pixels as the light modulator 14. Preferably, the geometries of the elements 14 and 18 should be as similar as possible. The detector 18 sends the signal to the controller 50, which reconstructs the written data from the obtained signal.

Figure 2:
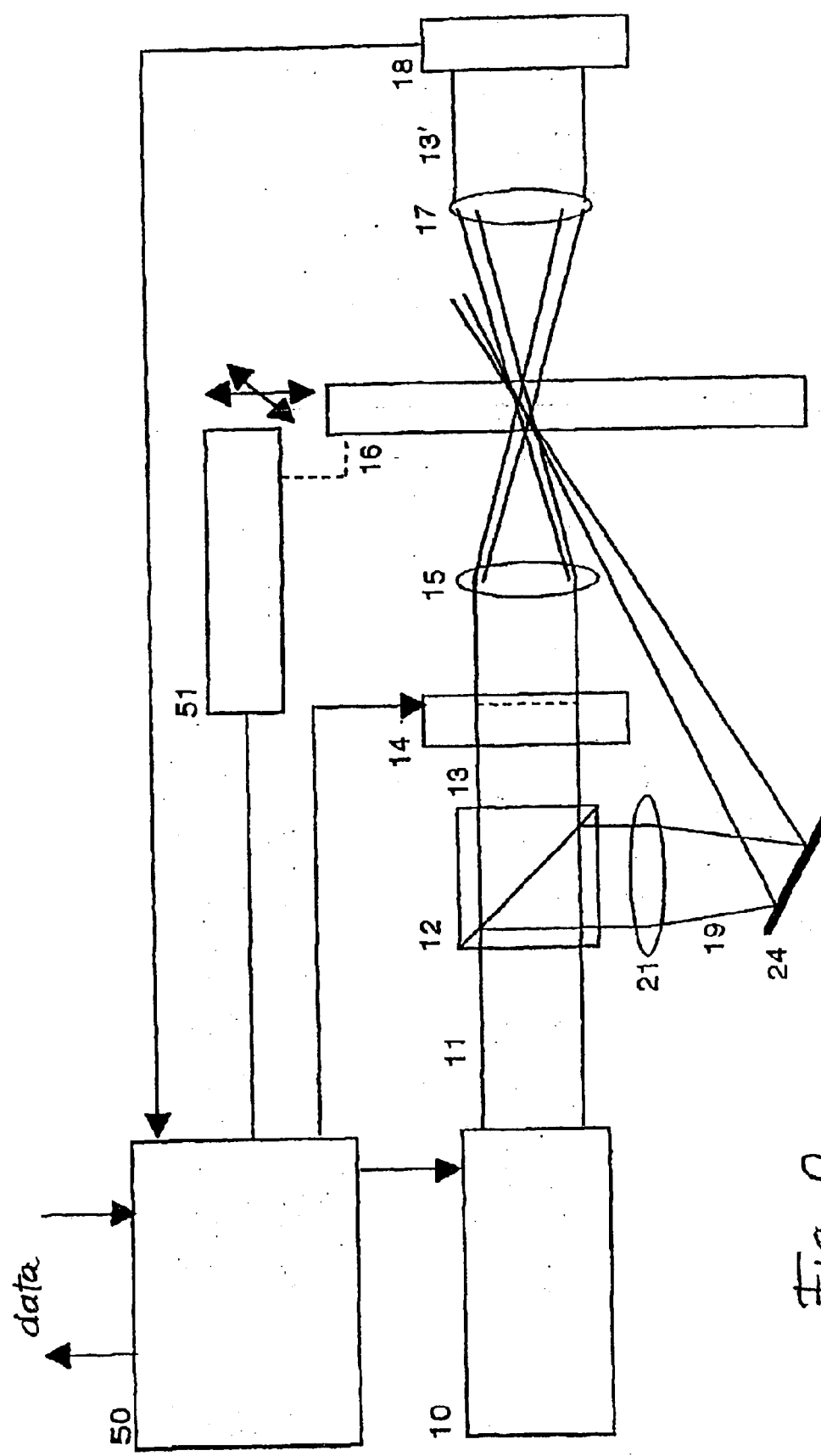
FIG. 2 is a schematic diagram of the system for holographic optical data storage and retrieval, which is a variation of the system in FIG. 1, differing therefrom in that the reference beam impinges upon the storage plate from the same direction as the signal beam.

FIG. 2 is a schematic diagram of a second embodiment of the system for holographic optical data storage and retrieval, which is a variation of the system in FIG. 1, differing therefrom in that the reference beam 19 impinges upon the storage plate 16 from the same direction as the signal beam 13. As in the previous case, it is required that the waist of the reference beam 19 lie in the median of the plate 16, which is achieved by appropriately selecting the distance from the lens 21 to the mirror 24 and further to the plate 16. In this case, the reference beam 19 impinges upon the plate 16 at an angle of 20 to 45 degrees, which does not alter the conditions of hologram writing and reading in a substantial degree.

The embodiment in FIG. 2 shows another possible modification of the second embodiment with respect to the first embodiment. The light modulator 14 is followed by the lens 15', which focuses the signal beam 13 into a beam, whose smallest diameter lies in the median of the plate 16. In this case, the readout process may also be carried out by means of the lens 17 focusing the reconstructed signal beam 13' and recreating the image on the detector 18.

Figure 3:
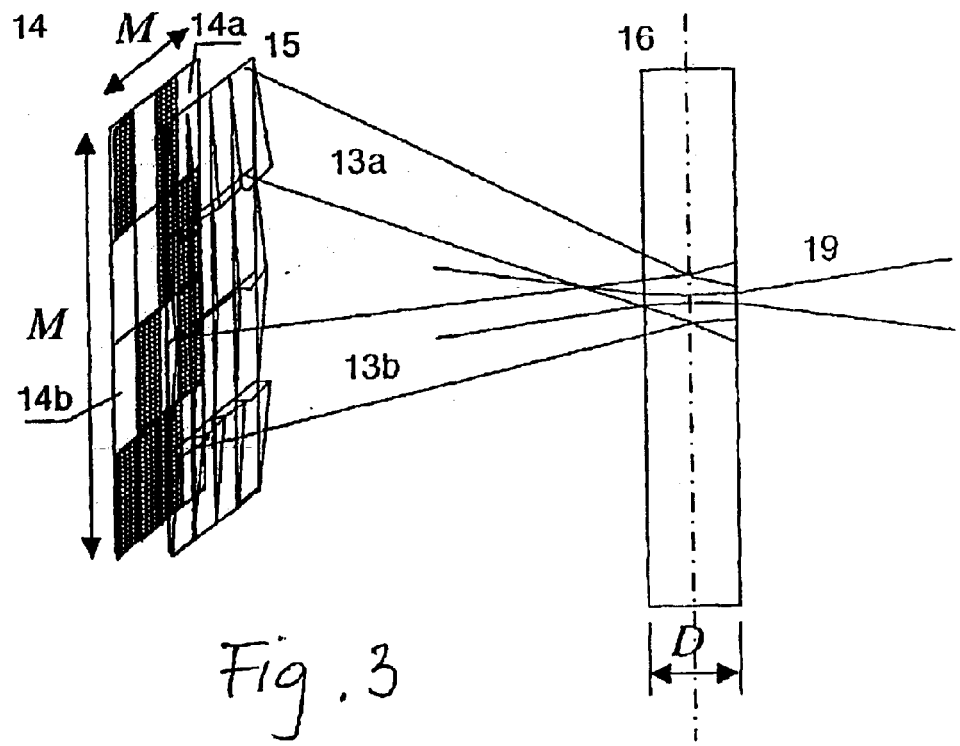
FIG. 3 is a detailed schematic diagram of a part of the system for holographic optical storage, showing the paths of selected portions of the signal and reference beams inside the storage material more in detail.

FIG. 3 is a detailed schematic diagram of a part of the system for holographic optical storage of the precedent embodiments, showing the paths of selected portions of the signal beam 13a and 13b and of the reference beam 19 inside the plate 16 of storage material more in detail. As shown in the figure, the volume of the plate 16, illuminated by the reference beam 19, is smaller than the volume illuminated by the signal beam. If the optical paths from the modulator 14 to the lens 15', which is shown only in FIG. 2, and from the lens 15 to the median of the plate 16, are equal to the focal length f of the lens 15, then a Fourier transform of the pattern on the modulator 14 is obtained in the median of the plate 16. At present, this is the most commonly used configuration, however, the present invention does not preclude other ways of focusing the signal beam, i. e. by putting the modulator 14 and the lens 15 in close contact, or by using microlenses 15, schematically shown in FIG. 3, in contact with the modulator 14.

Figure 4:
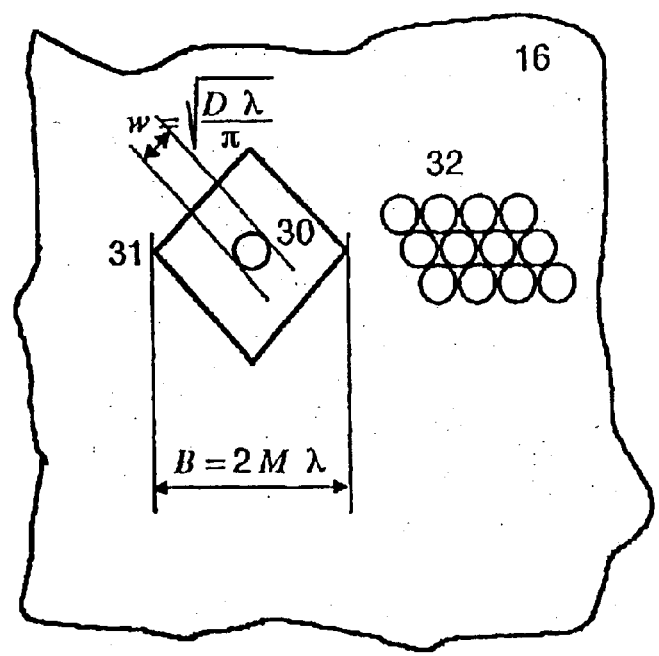
FIG. 4 is an illustration of the storage of the holograms in the plate, indicating the dimensions of the cross-sections of the reference and signal beams, with a schematic drawing of the stacked-together holograms.

FIG. 4 is a schematic illustration of the hologram storage plate as described in the preceding embodiments, viewed from a direction perpendicular thereto. The approximate size of the illuminated portion of the plate 16 during hologram writing is designated with the numerals 30 and 31, respectively. In the case of a modulator with square pixels and a focusing optics with the aperture f=1, the signal beam illuminates approximately a square 31, the diagonal of which is equal to (2 M lambda). Optimally, the cross-section of the reference beam 30 on the surface of the plate is equal to the square root of (D lambda/Pi). In FIG. 4, a possible configuration 32 of stacked holograms in the plate is shown, by means of which the maximum density of holograms may be achieved.

In view of the foregoing, the technical problem is solved by a method of storing volume holograms which do not mutually overlap, using a storage material for volume holography in the form of a plate 16. Writing is achieved through optical interference of the reference beam 19 and the modulated signal beam. 13, 13a, 13b, the angles between a line normal to the plane of the plate 16 of storage material and the axes of the signal beam 13 and reference beam 19, respectively, being smaller than 45 degrees. Into the plate 16, a plurality of holograms 32 are written, which do not mutually overlap. The diameter 30 of the reference beam 19 is smaller than the lateral extent 31 of the signal beam 13 in the illuminated portion of the plate 16. The volume of a single hologram is equal to the portion of the volume, illuminated in the plate 16 by the reference beam 19. The holograms 32 are written in the plate 16 closely together in both dimensions parallel to the plane of the plate 16.

In view of the foregoing, the technical problem is solved by a confocal holographic optical storage system with non-overlapping records, with high data density and parallel read/write operation, comprising:
a) a storage material for volume holography in the form of a plate 16 of thickness D, which may be variously shaped, having an average refractive index n,
b) a coherent source of light 10 with the wavelength in vacuum equal to lambda0,
c) optical elements for generating the reference light beam 19 for hologram writing,
d) optical elements and a light modulator 14 for generating the signal light beam 13, and
e) a two-dimensional, position-sensitive light detector 18 for the detection of the reconstructed signal beam 13'.

The optics, namely the optical elements 12, 20, 21, 22, 23, 15, 17, 21, 24 as described in the embodiments and conveniently positioned, are made in such a way that the angles between a line normal to the plane of the plate 16 and the axes of the signal beam 13 and the reference beam 19, respectively, are smaller than 45 degrees, while the diameter 30 of the reference beam 19 is smaller than the lateral extent 31 of the signal beam 13 in the illuminated portion of the plate 16. The coherent light source consists of a laser 10 with an output beam TEM00. The holograms 32 are written in the plate 16 closely together in both dimensions parallel to the plane of the plate 16.

In view of the foregoing, the technical problem is solved by a confocal holographic optical storage system with non-overlapping records, with high data density and parallel read operation, comprising:
a) a storage material for volume holography in the form of a plate 16 of thickness D, which may be variously shaped, having an average refractive index n,
b) a coherent source of light 10 with the wavelength in vacuum equal to lambda0,
c) optical elements for generating the reference light beam for reading out the holograms 32, and
d) a two-dimensional, position-sensitive light detector 18 for the detection of the reconstructed signal beam.

The optics, namely the optical elements 21, 22, 23 as described in the embodiments and conveniently positioned, are made in such a way that the angles between a line normal to the plane of the plate 16 and the axis of the reference beam 19 are smaller than 45 degrees, while the diameter 30 of the reference beam 19 is smaller than the lateral extent 31 of the signal beam 13 in the illuminated portion of the plate 16, used to write the holograms 32. The coherent light source consists of a laser 10 with an output beam TEM00. The device reads out holograms 32, written in the plate 16 closely together in both dimensions parallel to the plane of the plate 16. For readout, the device uses a reference beam 19 of opposite direction to the one used to write the holograms 32. This way, a phase conjugated signal beam is reconstructed, which is automatically focused into the image of the modulator 14. This means that the device requires no additional focusing optical elements to perform readout.

What is claimed is:

1. A method of storing volume holograms which do not mutually overlap, using a storage material for volume holography in the form of a plate, wherein writing is achieved through optical interference of reference and modulated signal beams, characterized in that a plurality of holograms, which do not mutually overlap, are written in the plate, the angles between a line normal to the plane of the plate and the axes of the signal and reference beams, respectively, are smaller than 45 degrees, the diameter of the waist of the reference beam is smaller than the lateral extent of the signal beam in the illuminated portion of the plate, and the volume of a single hologram is equal to the portion of the volume illuminated in the plate by the reference beam.

2. Method according to claim 1, characterized in that the optimal volume of a single hologram is approximately equal to $(D^2 = \text{lambda}0)/n$, wherein D is a thickness of the plate, lambda0 is a wavelength in a vacuum and n is a refractive index of the plate.

3. Method according to claim 1, characterized in that the holograms are written in the plate closely together in both dimensions parallel to the plane of the plate.

4. A confocal holographic optical storage system with non-overlapping records, with high data density and parallel read/write operation, characterized in that comprises:
   a) a storage material for volume holography in the form of a plate of thickness D, which may be variously shaped, having an average refractive index n,
   b) a coherent source of light with the wavelength in vacuum equal to lambda0.
   c) optical elements for generating the reference light beam for hologram writing and reading.
   d) optical elements and a light modulator for generating the signal light beam, and
   e) optical elements and a two-dimensional, position-sensitlve light detector for the detection of the reconstructed signal beam,
   wherein the optics are made in such a way that the angles between a line normal to the plane of the plate and the axes of the signal and reference beams, respectively, are smaller than 45 degrees, while the diameter of the waist of the reference beam is smaller than the lateral extent of the signal beam in the illuminated portion of the plate.

5. Confocal holographic optical storage system with non-overlapping records according to claim 4, characterized in that the coherent light source consists of a laser with an output beam TEM00.

6. Confocal holographic optical storage system with non-overlapping records according to claim 4, characterized in that optimally the number of independent elements of the light modulator which modulates the signal beam is equal to the square of (n times D divided by lambda).

7. Confocal holographic optical storage system with non-overlapping records according to claim 4, characterized in that the holograms are written in the plate closely together in both dimensions parallel to the plane of the plate.

8. Confocal holographic optical storage system with non-overlapping records with high data density and parallel read operation, characterized in that it comprises:
   a) a storage material for volume holography in the foim of a plate of thickness D, which may be variously shaped, having an average refractive index n,
   b) a coherent source of light with the wavelength in vacuum equal to lambda0,
   c) optical elements for generating the reference light beam for hologram readout, and
   d) a two-dimensional, position-sensitive light detector for the detection of the reconstructed signal beam,
   wherein the optics are made in such a way that the angle between a line normal to the plane of the plate and the axis of the reference beam is smaller than 45 degrees, while the diameter of the waist of the reference beam is smaller than the lateral extent of the signal beam in the illuminated portion of the plate, used to write the holograms.

9. Confocal holographic optical storage system with non-overlapping records according to claim 8, characterized in that the coherent light source consists of a laser with an output beam TEM00.

10. Confocal holographic optical storage system with non-overlapping records according to claim 8, characterized in that optimally the number of independent elements of the light modulator which modulates the signal beam is equal to the square of (n times D divided by lambda0).

11. Confocal holographic optical storage system with non-overlapping records according to claim 8, characterized in that the holograms are written in the plate closely together in both dimensions parallel to the plane of the plate.

* * * * *